United States Patent [19]

Su

[11] Patent Number: 4,961,621

[45] Date of Patent: Oct. 9, 1990

[54] OPTICAL PARALLEL-TO-SERIAL CONVERTER

[75] Inventor: Shing-Fong Su, Southboro, Mass.

[73] Assignee: GTE Laboratories, Inc., Waltham, Mass.

[21] Appl. No.: 288,583

[22] Filed: Dec. 22, 1988

[51] Int. Cl.⁵ .................. G02B 6/28; G11C 19/00; G06F 1/00; H04J 3/00

[52] U.S. Cl. .................. 350/96.16; 350/96.13; 350/96.14; 350/96.15; 350/355; 350/356; 377/64; 364/200; 364/713; 370/4; 307/409

[58] Field of Search ........... 350/96.13, 96.14, 96.15, 350/96.16, 96.29, 354, 96.10, 355, 393, 356; 377/64, 70, 74; 364/200, 713, 822, 824; 370/1, 3, 4; 455/608, 610, 612, 617; 307/409

[56] References Cited

U.S. PATENT DOCUMENTS

| | | | |
|---|---|---|---|
| 2,833,936 | 5/1958 | Ress | 350/96.29 X |
| 3,208,342 | 9/1965 | Nethercot, Jr. | 350/96.29 X |
| 3,670,166 | 6/1972 | Kaminow | 370/4 X |
| 3,781,081 | 12/1973 | Rokos | 350/96.14 X |
| 4,154,501 | 5/1979 | Fischer | 350/96.25 |
| 4,363,106 | 12/1982 | Tai | 364/713 X |
| 4,382,660 | 5/1983 | Pratt, Jr. et al. | 372/18 X |
| 4,473,270 | 9/1984 | Shaw | 350/96.15 |
| 4,577,189 | 3/1986 | Adolfsson et al. | 250/213 A |
| 4,588,255 | 5/1986 | Tur et al. | 350/96.16 |
| 4,748,630 | 5/1988 | Nagashima | 372/8 X |
| 4,761,060 | 8/1988 | Sawano | 350/354 |
| 4,778,239 | 10/1988 | Shaw et al. | 350/96.16 |
| 4,890,893 | 1/1990 | Smoot | 350/96.15 |
| 4,900,115 | 2/1990 | Heuring et al. | 350/96.15 |
| 4,909,584 | 3/1990 | Imoto et al. | 350/96.15 |

FOREIGN PATENT DOCUMENTS 58-187912 11/1983 Japan .................. 350/96.14 X
60-58792 4/1985 Japan .................. 370/4 X

OTHER PUBLICATIONS

Callahan, "Optical Delay Line Compressor", IBM Tech Discl. Bull., vol. 14, No. 8, Dec. 1971, pp. 2208-2209.
An Ultra Fast All-Optical Switch.
R. A. Thompson and P. P. Giordano, "An experimental photonic time-slot interchanger using optical fibers as reentrant delay-line memories," J. Lightwave Technology, vol. LT-5, pp. 154-162, Jan. 1987.
H. Goto, "Photonic time-division switching technology", Technology Digest, Topical Meeting on Photonic Switching, pp. 132-134, Mar. 1987.

Primary Examiner—William L. Sikes
Assistant Examiner—Brian M. Healy
Attorney, Agent, or Firm—James J. Cannon, Jr.

[57] ABSTRACT

An optical parallel-to-serial converter constructed from at least two optical shift registers coupled in cascade by an optical two-to-one combiner. The input port of the first optical shift register serves as one input to the parallel-to-serial converter, an extra optical combiner optically coupled to the last of said optical shift registers serves as one input port, while the optical combiners coupling said optical shift registers serve as the other input ports receiving parallel optical pulses. The output port of the last of said cascaded optical shift registers serves as the output port of the parallel-to-serial converter. The shift registers are controlled by two clocks, operating at the same rate, but each out of phase with the other, providing control signals to shift and output said optical pulses serially from said shift registers to effect a parallel-to-serial conversion.

13 Claims, 1 Drawing Sheet

OPTICAL PARALLEL-TO-SERIAL CONVERTER

BACKGROUND OF THE INVENTION

This invention relates to optical components generally, that is, components which operate in the optical domain. Such components are designed for use in various systems which utilize optical fibers, such as optical communications systems, optical data processing systems and optical switching systems. Specifically, this invention pertains to an optical parallel-to-serial converter.

The development of optical fiber and optical semiconductor technologies in recent years has made possible various types of optical communications systems and optical switching systems. To utilize the full bandwidth and speed available in optical systems, it has become necessary to design and fabricate optical logic and switching components which eliminate the necessity for electrical-to-optical and optical-to-electrical conversions.

With future communications networks being projected to have terabit capacity, light-speed transmission alone does not suffice for the full utilization of available bandwidth. At present, the high bandwidth advantage of optical fibers is still not fully utilized because electronic switching systems are not fast enough for high speed and high throughput optical switching. To solve this problem, the switching functions must be performed in the optical domain, eliminating the optical-to-electrical and electrical-to-optical conversions. Switching and multiplexing with the speed of light is necessary. Consequently, the success of terabit networks relies on the successful development of photonic switching and signal processing systems. Since no electrical-to-optical or optical-to-electrical conversion will be allowed in these systems, pure optical subsystems, such as optical memory cells, optical shift registers, optical serial-to-parallel converters and optical parallel-to-serial converters, will play important roles in these systems.

SUMMARY OF THE INVENTION

The principal object of the present invention is to provide an optical parallel-to-serial converter in which parallel optical pulses are converted to serial optical pulses without optical-to-electrical or electrical-to-optical conversion.

Another object of the invention is to provide an optical parallel-to-serial converter in which adjacent optical pulses are well isolated, causing no crosstalk among time slots.

Still another object of the present invention is to provide an optical parallel-to-serial converter which is simple in both structure and operation, but which has none of the shortcomings of prior combinations of optical devices or electronic equivalents when used in optical systems.

A further object of the invention is to provide an optical parallel-to-serial converter in which the speed of the parallel-to-serial converter may be adjusted according to the incoming optical data rate.

Still a further object of the invention is to provide an optical parallel-to-serial converter for which the control timing is simple.

Another object of the invention is to provide an optical parallel-to-serial converter which can be implemented using integrated optics technology.

This invention is an optical parallel-to-serial converter having a plurality of input ports to receive simultaneously a set of parallel optical pulses and a single output port to present said optical pulses serially at its output. Said optical parallel-to-serial converter is constructed from a plurality of single bit optical shift registers optically coupled by 2-to-1 passive optical combiners.

In one aspect of the invention, a three-bit optical parallel-to-serial converter consists of two cascaded single bit optical shift registers optically coupled by a 2-to-1 optical combiner. This optical converter has three input ports, each of which is one input of a 2-to-1 optical combiner. One optical combiner is the input to the first cascaded optical shift register; one is the optical coupler between the two optical shift registers and the third is added to the last optical shift register closest to the output port. Each single bit optical shift register consists of two cascaded optical memory cells, each memory cell having a $1 \times 2$ optical switch, a passive optical combiner, delay line fibers and an optical amplifier. The two optical switches in the single bit optical shift registers are controlled respectively by a first clock and a second clock, running at the same rate, but out of phase with each other. When the first clock controlling both single bit optical shift registers is low, one optical pulse can enter each of the optical shift registers of the optical converter through the first two input ports of the optical converter and into the respective first memory cells. At the same time, the second clock controlling both optical shift registers is high so one optical pulse entering through a third input port closest to the output port will bypass a memory cell and become the first serial optical pulse to exit the optical converter. When the first clock switches to high and the second clock to low, the remaining optical pulses are shifted to the next sequential optical memory cell. When the clocks again change to first clock low and second clock high, the leading optical pulse can exit the last single bit optical shift register of the optical converter. Thus, after all optical pulses enter the optical converter in parallel, they are shifted from the first single bit optical shift register to the next until all said shift registers are empty. This enter-shift-exit cycle repeats at the rate of the first and second clocks, until each single bit optical shift register in the optical converter shifts to the output its optical pulse, at which time the conversion of parallel optical bits to serial optical bits is completed. The conversion cycle repeats itself at a rate equal to the input clock rate divided by N, where N is the number of parallel bits in each conversion cycle.

In a second aspect of the invention, a multibit optical parallel-to-serial converter is constructed by cascading a larger number of single bit optical shift registers together. For an N bit word, to be converted from parallel to serial, $N-1$ shift registers are required, N input ports, $N-1$ passive optical combiners (in addition to those in the optical shift registers) primarily to couple said optical shift registers while providing input ports, and the conversion cycle repeats at the clock rate of the optical shift register clocks divided by N. There is no change in the operational principles.

The above and other objects, features and advantages of this invention are illustrated in the following detailed description, in which reference is made to the accompanying drawings.

DESCRIPTION OF THE PREFERRED EMBODIMENTS

Figure 1:
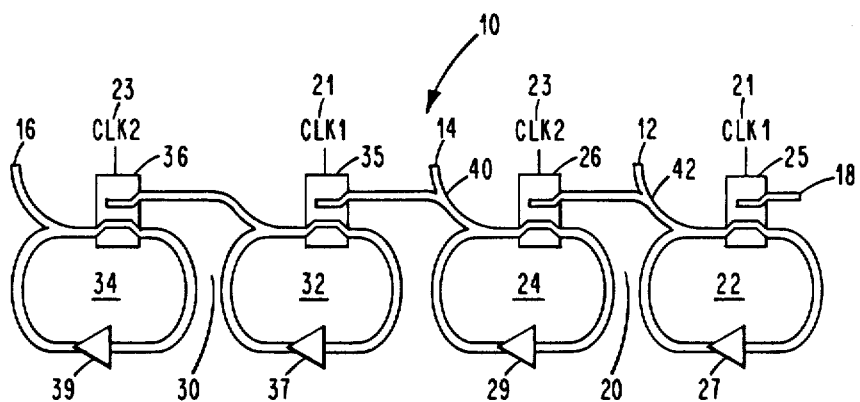
FIG. 1 is a diagrammatic illustration of the preferred embodiment of a three-bit optical parallel-to-serial converter according to the present invention.

FIG. 1 is a diagrammatic illustration of the preferred embodiment of a three-bit optical parallel-to-serial converter 10 constructed in accordance with the principles of the present invention. Three-bit converter 10 consists of two cascaded single bit optical shift registers 20, 30 comprising two cascaded single bit optical memory cells 22, 24, 32, 34. The optical memory cell described and illustrated herein has been disclosed in a copending U.S. patent application entitled OPTICAL MEMORY CELL, Ser. No. 280,396, filed Dec. 5, 1988 by the inventor of this application and assigned to the same assignee as this application. The optical shift register described and illustrated herein has been disclosed in a copending U.S. patent application entitled OPTICAL SHIFT REGISTER, Ser. No. 280,045, filed Dec. 5, 1988 pending, by the inventor of this application and assigned to the same assignee as this application. These two related applications are incorporated herein by reference, and specifically the drawings and the descriptions of the preferred embodiments are incorporated herein by reference with respect to the structure and operation of said single bit optical memory cell and of said single bit optical shift register.

Optical memory cells 22, 32, are controlled by a first clock 21, while memory cells 24, 34 are controlled by a second clock 23, and said memory cells include $1 \times 2$ optical switches 25, 26, 35, 36 and optional optical amplifiers 27, 29, 37, 39. Single bit optical shift registers 20, 30 are cascaded to form optical converter 10 by optically coupling the output of first optical shift register 30 through a 2-to-1 passive optical combiner 40 to an input of optical shift register 20. The second input of optical combiner 40 serves as one of the input ports to the optical converter 10, as will be described below. Three-bit optical parallel-to-serial converter 10 has three input ports 12, 14, 16 to receive simultaneously a set of three parallel optical pulses and one output port 18 to output said optical pulses serially.

Figure 2:
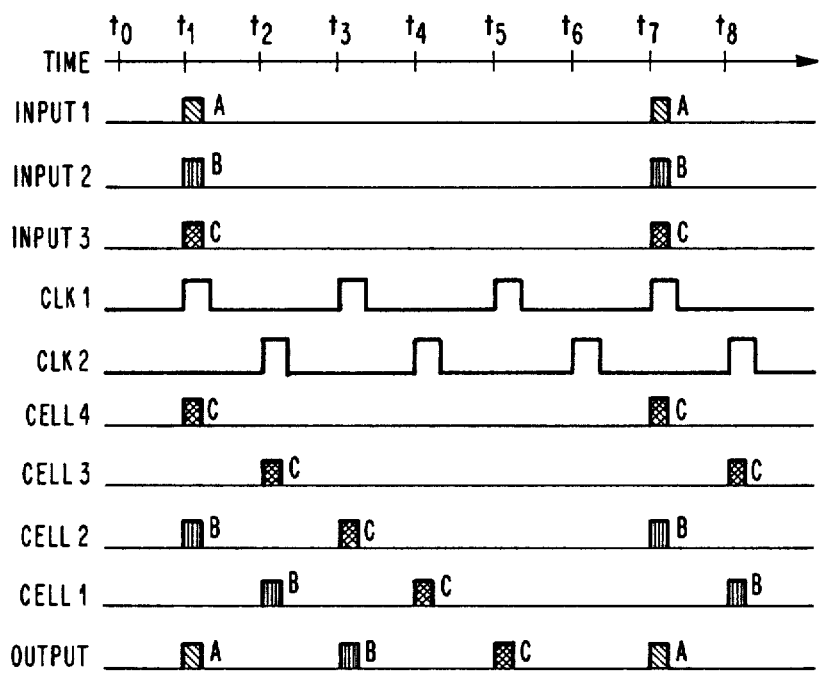
FIG. 2 is a timing control diagram of the three-bit optical parallel-to-serial converter of FIG. 1.

Referring again to FIG. 1, three-bit optical parallel-to-serial converter consists of two cascaded one-bit shift registers 20, 30 and two 2-to-1 optical combiners 40, 42. Optical combiner 40 serves to optically couple the cascaded shift registers 20, 30 through one of its inputs, while serving as input port 14 through its second input. Optical combiner 42 is optically coupled between the two optical memory cells 22, 24 of optical shift register 20. Optical switches 25, 35 are controlled by clock 21, while optical switches 26, 36 are controlled by clock 23. All of the optical switches are in the cross-over state when their controlling clocks are high. They are in the straight-through state when their controlling clocks are low. These clocks may be optical or electrical, depending on the types of optical switches used. If the optical switches are $LiNbO_3$-based directional couplers or cross-couplers, the clocks are electrical. If the optical switches are pure optical switches, then the clocks are optical. As shown in FIG. 2, clocks 21 and 23 run at the same rate, but out of phase with each other. The duty cycles of all clocks in converter 10 are less than fifty percent. This prevents adjacent optical pulses from being mixed together. The optical amplifiers, 27, 29, 37, 39 are used to compensate for the optical losses caused by the various optical components in converter 10. These optical amplifiers could be discrete components or distributed optical fiber amplifiers.

The operation of the optical parallel-to-serial converter 10 is illustrated in FIG. 2. As shown in FIG. 2, the controlling clocks 21, 23 are running at the same rate, but out of phase with each other. To elucidate the conversion process of the optical parallel-to-serial converter 10, we assume that it is empty at the beginning, time $t = t_0$. At time $t = t_1$, clock 21 is high, clock 23 is low, optical switches 25, 35 are in the cross-over state and the other optical switches are in the straight-through state, and three optical pulses A, B, C appear at input ports 12, 14, 16. Optical pulse A coming from input port 12 through optical combiner 42 exits immediately from output port 18 via optical switch 25. At the same time, optical pulse B coming from input port 14 through optical combiner 40 enters optical memory cell 24, and optical pulse C coming from input port 16 through the input to optical shift register 30 enters optical memory cell 34. At $t = t_2$, clock 21 is low, clock 23 is high, optical switches 26, 36 are in the cross-over state, and optical pulse B shifts from optical memory cell 24 and enters memory cell 22, while optical pulse C shifts from optical memory cell 34 to optical memory cell 32. At $t = t_3$, clock 21 is high, clock 23 is low, switches 25, 35 are in the cross-over state, and optical pulse B exits from output port 18, while optical pulse C shifts from memory cell 32 to memory cell 24. At $t = t_4$, clock 21 is low, clock 23 is high, switch 26 is in the cross-over state, and optical pulse C shifts from memory cell 24 to memory cell 22 in optical shift register 20. At $t = t_5$, optical pulse C exits from output port 18. Thus, the conversion of three parallel optical pulses or bits A, B, and C to serial optical pulses or bits is complete. At time $t_6$, nothing happens. At $t = t_7$, the next conversion cycle begins. The conversion cycle repeats the rate of clock 21/N, where N is the number of parallel bits in each conversion cycle. For example, N equals 3 for a three-bit optical parallel-to-serial converter.

Table 1 summarizes the operation process described above. It should be pointed out that optical pulses B and C may enter optical memory cells 24, 34 respectively at any time when clock 23 is low and stays low long enough for the optical pulses to get into the cells. The shifts from memory cell 34 to memory cell 32 and from memory cell 24 to memory cell 22 are triggered by a pulse from clock 23. Therefore, these shifts begin at the moment when clock 23 changes from low to high. Similarly, the shift from memory cell 32 to memory cell 24 and the outputting of an optical pulse begin at the moment when clock 21 changes from low to high. The clock rate of clocks 21, 23 can be adjusted to synchronize with the incoming optical data rate.

While FIG. 1 shows only a three-bit optical parallel-to-serial converter, it should be obvious to one skilled in the art to extend the bit length of two-bit optical parallel-to-serial converter 10. Multi-bit optical parallel-to-serial converters can be constructed by cascading a number of single it optical shift registers together. The principles of operation do not change at all. For N parallel bits or optical pulses to be converted to serial bits or optical pulses, N−1 single bit optical shift registers and N−1 optical combiners are required, (N−2 passive optical combiners coupling the optical shift registers and the additional optical combiner adjacent to the output). Only two clocks are required for the N bit optical parallel to-serial converter.

A variety of photonic systems, subsystems and/or components can be implemented which are based on and/or utilize the optical parallel-to-serial converter of the present invention, such as optical time slot interchangers. The optical parallel-to-serial converter is a needed building block for photonic switching. It enables a variety of optical switching architectures which were not considered feasible before.

The novel optical parallel-to-serial converter of the present invention offers many features and advantages over prior art devices, most of which were not optical devices. Parallel optical pulses are converted to serial optical pulses without optical-to-electrical or electrical-to-optical conversion. The adjacent optical pulses are well isolated, causing no crosstalk among time slots. This optical parallel-to-serial converter can be implemented using integrated optics technology, principally because the physical length of the optic fiber is short. The speed of the optical parallel-to-serial converter may be adjusted according to the incoming data rate. And timing control of this novel optical parallel-to-serial converter is relatively easy and simple.

TABLE 1

Summary of the operation of the optical parallel-to-serial converter.

| Time | 1 | 2 | 3 | 4 | 5 | 6 | 7 | 8 | 9 | 10 | 11 |
|---|---|---|---|---|---|---|---|---|---|---|---|
| CLK1 | H | L | H | L | H | L | H | L | H | L | H |
| CLK2 | L | H | L | H | L | H | L | H | L | H | L |
| Input 3 | C | — | — | — | — | — | C | — | — | — | — |
| Input 2 | B | — | — | — | — | — | B | — | — | — | — |
| Input 1 | A | — | — | — | — | — | A | — | — | — | — |
| Cell 4 | C | — | — | — | — | — | C | — | — | — | — |
| Cell 3 | — | C | — | — | — | — | — | C | — | — | — |
| Cell 2 | B | — | C | — | — | — | B | — | C | — | — |
| Cell 1 | — | B | — | C | — | — | — | B | — | C | — |
| Output | A | — | B | — | C | — | A | — | B | — | C |

Note: H means high and L means low.

I claim:

1. An optical parallel-to-serial converter, comprising:
   optical input means adapted to simultaneously receive sets of N optical pulses;
   optical storage means comprising:
   N−1 single bit optical shift registers, each of said shift registers having an input port adapted to receive optical pulses and an output port adapted to output optical pulses responsive to control signals;
   means to optically couple said N−1 optical shift registers in cascade such that the output port of one optical shift register is optically coupled to the input port of the next sequential optical shift register in said cascade;
   each of said single bit optical shift registers having means to optically store and optically shift a single optical pulse responsive to control signals; and
   means to load and shift all but one of a set of N parallel optical pulses received at the inputs of said optical converter into said cascaded optical shift registers so that each of said N−1 optical shift registers has stored one of said optical pulses;
   said optical storage means being optically coupled to said optical input means and adapted to store temporarily all but one of said optical pulses of a set as received;
   optical output means optically coupled to said optical storage means adapted to output serially all of said N optical pulses, commencing with a first optical pulse as soon as said N optical pulses have been received; and
   control means adapted to provide signals to control the input, storage and output of said optical pulses.

2. The optical parallel-to-serial converter of claim 1, wherein said optical output means comprises:
   the output port of the last one of said cascaded N−1 optical shift registers.

3. The optical parallel-to-serial converter of claim 2 wherein said means to optically couple each of said N−1 optical shift registers in cascade comprises:
   a 2-to-1 optical combiner having a first input end optically coupled to the output of a first optical shift register and its output end optically coupled to the input of the next sequential optical shift register; and
   its second input end serving as an input port for one of said N parallel optical pulses 4. The optical parallel-to-serial converter of claim 1 wherein said control means comprises:
   first and second clock means to provide control signals to each of said optical shift registers;
   each of said optical shift registers having the same first and second clock means operating at the same clock rate, but said first and second clock means being out of phase with each other;
   said first and second clock means controlling the entry of said optical pulses to each of said optical shift registers and the serial exit of said optical pulses from each of said optical shift registers thereby controlling the output of said parallel-to-serial converter;
   whereby the conversion of a set of parallel optical pulses to a series of optical pulses results from the serial exit of said pulses from the last cascaded optical shift register.

5. The optical parallel-to-serial converter of claim 1 wherein each of said single bit optical shift registers comprises:
   at least two optical memory cells, each of said optical memory cells having an input port and an output port;
   means to optically couple said optical memory cells in cascade;
   each of said optical memory cells having clock means operating at the same clock rate, but each clock means being out of phase with said clock means in the next sequential optical memory cell;
   said clock means controlling the entry of an optical pulse to each of said optical memory cells and the exit of said optical pulse from each of said optical memory cells;
   whereby the shifting of an optical pulse results from its exit from a first optical memory cell and its entry into the next sequential optical memory cell.

6. The optical parallel-to-serial converter of claim 5, wherein each of said optical memory cells comprises:
   an optical switch means having an input end adapted to receive an optical pulse, a first output end, a second output end and a switch control means, said switch control means being adapted to switchably couple an optical pulse from said first input end to said first output end in its straight-through state and to switchably couple an optical pulse from said input end to said second output end in its crossover state, responsive to control signals applied to said switch control means;

an optical combiner having first and second input ends and an output end adapted to receive an optical pulse on either input end and output said optical pulse on said output end;

an optical fiber connecting said output end of said optical combiner to said input end of said optical switch;

an optical fiber connecting said first output end of said optical switch to said second input end of said optical combiner;

such that said optical switch in its straight-through state, said optical combiner and said optical fibers form an optical loop capable of storing a circulating optical pulse;

said first input end of said optical combiner serving as an input means to said optical loop;

said second output end of said optical switch serving as an output means from said optical loop when said optical switch is in its cross-over state.

7. The optical parallel-to-serial converter of claim 6, further comprising:
an optical amplifier positioned within said loop to compensate for optical losses incurred by an optical pulse circulating within said loop.

8. The optical parallel-to-serial converter of claim 6, wherein said optical switch means is an electro-optical switch.

9. The optical parallel-to-serial converter of claim 6, wherein said optical switch means is a directional coupler.

10. The optical parallel-to-serial converter of claim 6, wherein said optical switch means is a cross-coupler.

11. The optical parallel-to-serial converter of claim 6, wherein said optical switch means is a nonlinear optical coupler.

12. The optical parallel-to-serial converter of claim 4, wherein said optical combiner is a fiber coupler.

13. The optical parallel-to-serial converter of claim 4, wherein said optical combiner is a waveguide coupler.

* * * * *